(12) United States Patent
Endo (10) Patent No.: US 11,061,054 B2
(45) Date of Patent: Jul. 13, 2021

(54) CURRENT MEASURING DEVICE (71) Applicant: KOA CORPORATION, Ina (JP)

(72) Inventor: Tamotsu Endo, Nagano (JP)

(73) Assignee: KOA CORPORATION, Nagano (JP)

( * ) Notice: Subject to any disclaimer, the term of this patent is extended or adjusted under 35 U.S.C. 154(b) by 0 days.

(21) Appl. No.: 16/624,640

(22) PCT Filed: Jun. 25, 2018

(86) PCT No.: PCT/JP2018/023931
§ 371 (c)(1),
(2) Date: Dec. 19, 2019

(87) PCT Pub. No.: WO2019/009112
PCT Pub. Date: Jan. 10, 2019

(65) Prior Publication Data
US 2020/0182914 A1 Jun. 11, 2020

(30) Foreign Application Priority Data

Jul. 3, 2017 (JP) .............................. JP2017-130591

(51) Int. Cl.
G01R 19/155 (2006.01)
G01R 19/00 (2006.01)

(52) U.S. Cl.
CPC ....... *G01R 19/155* (2013.01); *G01R 19/0053* (2013.01)

(58) Field of Classification Search
None
See application file for complete search history.

(56) References Cited

U.S. PATENT DOCUMENTS

| 2005/0057865 A1* | 3/2005 | Veloo | G01R 31/364 361/56 |
|---|---|---|---|
| 2008/0050985 A1* | 2/2008 | Roset | G01R 31/364 439/754 |
| 2014/0125429 A1* | 5/2014 | Yoshioka | G01R 1/203 333/172 |
| 2014/0239947 A1* | 8/2014 | Nakajima | G01R 15/20 324/251 |

FOREIGN PATENT DOCUMENTS

| JP | 2010-236981 A | 10/2010 |
| JP | 2013-174555 A | 9/2013 |
| JP | 2015-017832 A | 1/2015 |

* cited by examiner

*Primary Examiner* — Jas A Sanghera
(74) *Attorney, Agent, or Firm* — Brinks Gilson & Lione (57) ABSTRACT

Provided is a current measuring device for measuring current, including a conductor adapted to pass current therethrough, a circuit board with a wire, the wire being adapted to extract a voltage signal from the conductor, a cover member adapted to house the circuit board, first fixing means provided on the cover member, and second fixing means fixed in combination with the first fixing means, in which the conductor is mounted between the first fixing means and the second fixing means.

5 Claims, 7 Drawing Sheets

CURRENT MEASURING DEVICE

This application is a 371 application of PCT/JP2018/023931 having an international filing date of Jun. 25, 2018, which claims priority to JP2017-130591 filed Jul. 3, 2017, the entire content of which of which is incorporated herein by reference.

TECHNICAL FIELD

The present invention relates to a current measuring device.

BACKGROUND ART

Simpler coupling structures are demanded for coupling a circuit board having a current sensing circuit formed thereon and a shunt resistor for sensing current. Meanwhile, circuit boards sometimes have isolation amplifiers mounted thereon, for example, but are also demanded to have a smaller size.

Patent Literature 1, for example, describes a structure in which a shunt resistor and a circuit board incorporating a temperature sensing circuit are disposed inside a case. Such a structure can sense the amount of current flowing through a battery (or cells) so as to sense the state of charge of the battery.

CITATION LIST

Patent Literature

Patent Literature 1: JP 2013-174555 A

SUMMARY OF INVENTION

Technical Problem

There may be cases where one wants to mount electronic components, such as a microcomputer and an amplifier, for processing sensed signals on the aforementioned circuit board incorporating the temperature sensing circuit, for example.

However, the conventional structure has a problem in that mounting electronic components on the circuit board results in an increased overall size of the device.

It is an object of the present invention to reduce the size of a current measuring device. It is another object of the present invention to improve the mountability of electronic components on the current measuring device.

Solution to Problem

According to an aspect of the present invention, there is provided a current measuring device for measuring current, including a conductor adapted to pass current therethrough, a circuit board with a wire, the wire being adapted to extract a voltage signal from the conductor, a cover member adapted to house the circuit board, first fixing means provided on the cover member, and second fixing means fixed in combination with the first fixing means, in which the conductor is mounted between the first fixing means and the second fixing means.

According to the aforementioned current measuring device, the circuit board can be fixed to the conductor together with the cover member.

The circuit board is preferably disposed upright with respect to the conductor. The circuit board may be disposed within the plane of the conductor. This can reduce the footprint of the current measuring device when mounted.

A pair of terminals may be disposed upright on the conductor, and wires of the circuit board and the respective pair of terminals may be coupled together.

The current measuring device may further include a bus bar disposed between the first fixing means and the second fixing means.

The present specification incorporates the disclosure of JP Patent Application No. 2017-130591 that forms the basis of the priority claim of the present application.

Advantageous Effects of Invention

According to the present invention, a compact current measuring device can be provided.

DESCRIPTION OF EMBODIMENTS

Hereinafter, a current measuring device according to an embodiment of the present invention will be described in detail with reference to the drawings. A shunt resistor and a circuit board shall be collectively referred to as a "body," and a current measuring device can be formed by attaching the body to a case.

In this specification, the direction in which an electrode, a resistive element, and another electrode of a resistor are arranged in this order shall be referred to as a "length direction," and the direction crossing the length direction shall be referred to as a "width direction." In addition, the direction perpendicular to the plane of the resistor shall be referred to as a "perpendicular direction." The same is true of the definition of a circuit board and the like.

First, a current measuring device according to the first embodiment of the present invention will be described.

Figure 1:
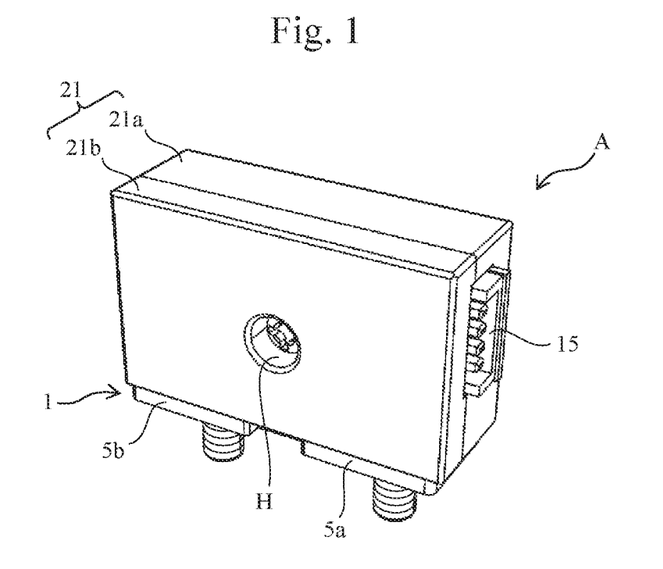
FIG. 1 is a perspective view of an exemplary external configuration of a current measuring device according to a first embodiment of the present invention.
Figure 2:
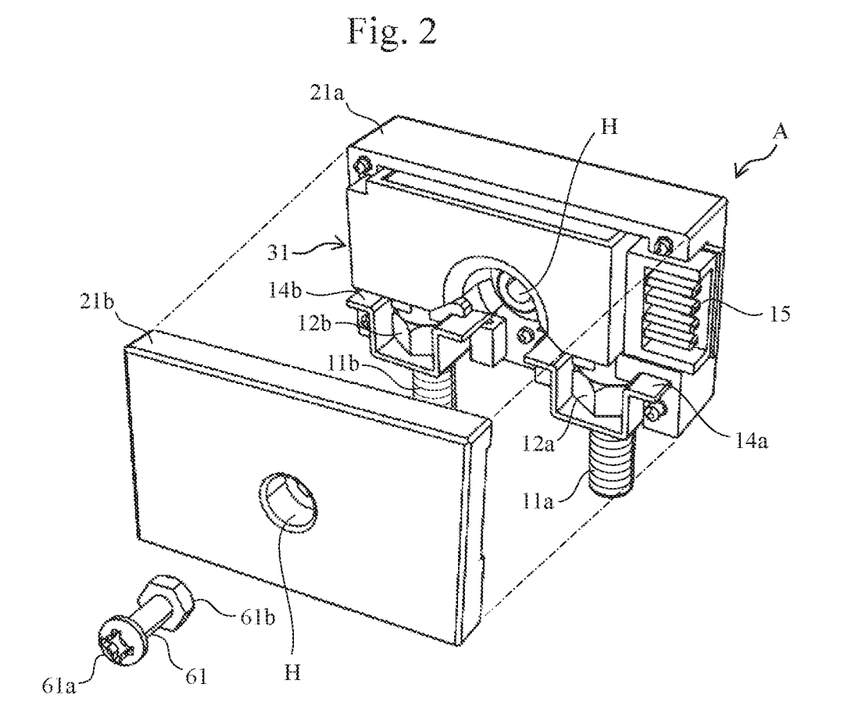
FIG. 2 is a perspective view of an exemplary external configuration of the current measuring device of FIG. 1, in which the front-side case is removed from the back-side case so as to allow an internal structure including a circuit board to be seen.
Figure 3:
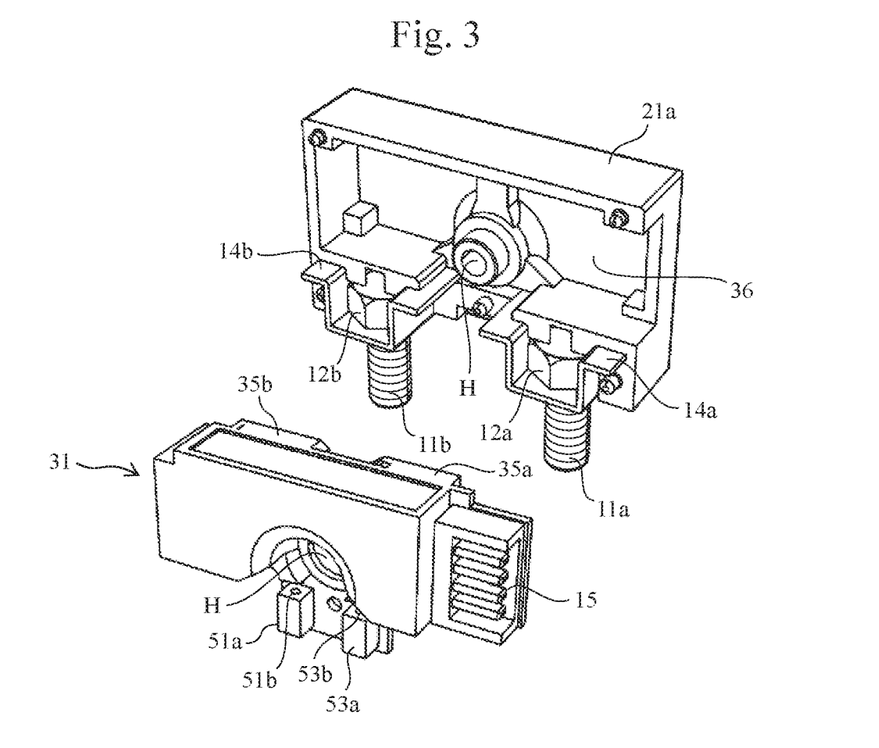
FIG. 3 is a perspective view of an exemplary external configuration including the back-side case with the circuit board in FIG. 2 removed.

FIG. 1 is a perspective view of an exemplary external configuration of the current measuring device according to the present embodiment. FIG. 2 is a perspective view of an exemplary external configuration of the current measuring device of FIG. 1 in a state in which a front-side case 21b is detached from a back-side case 21a of a case (i.e., a cover member or a module box) 21 that houses a circuit board so as to allow an internal structure including the circuit board to be seen. FIG. 3 is a perspective view of an exemplary external configuration including the back-side case 21a with a circuit board 31 in FIG. 2 removed.

As illustrated in FIGS. 1 to 3, the current measuring device A according to the present embodiment includes fixing brackets 14a and 14b, for example, each made of metal and having a substantially U-shaped cross-section, fixed to the bottom side of the back-side case 21a in the positional relationship illustrated in FIGS. 1 to 3. Fixing screws 11a and 11b (i.e., first fixing means) for fixing a shunt resistor and the like are mounted within the fixing brackets 14a and 14b, respectively. More specifically, heads 12a and 12b of the screws 11a and 11b are housed in respective concave portions of the fixing brackets 14a and 14b to reinforce the fixation of the screws 11a and 11b to the case 21 and prevent the screws 11a and 11b from spinning.

As described above, in the current measuring device A according to the present embodiment, fixing means for fixing a conductor (i.e., current sensing conductor), such as a shunt resistor, is provided within the case 21.

Further, as illustrated in FIG. 3, the circuit board 31 is housed in a housing portion 36 formed within the back-side case 21a. The circuit board 31 includes a terminal portion 15 for coupling the circuit board 31 to an external circuit, for example; electronic components 35a and 35b provided on the circuit board 31; and terminal fixing portions 51a and 53a having terminal fixing portions (i.e., fixing holes) 51b and 53b for fixing voltage sensing terminals provided on a conductor, such as a shunt resistor.

It should be noted that as illustrated in FIGS. 1 and 2, through-holes H are provided in the centers of the back-side case 21a, the front-side case 21b, and the circuit board 31, and these can be fixed together via the through-holes H using a bolt 61, a screw 61a, and a nut 61b illustrated in FIG. 2.

Next, coupling of the case 21 and conductors, such as a shunt resistor and bus bars, will be described. Hereinafter, a shunt resistor will be exemplarily described as a conductor.

Figure 4A:
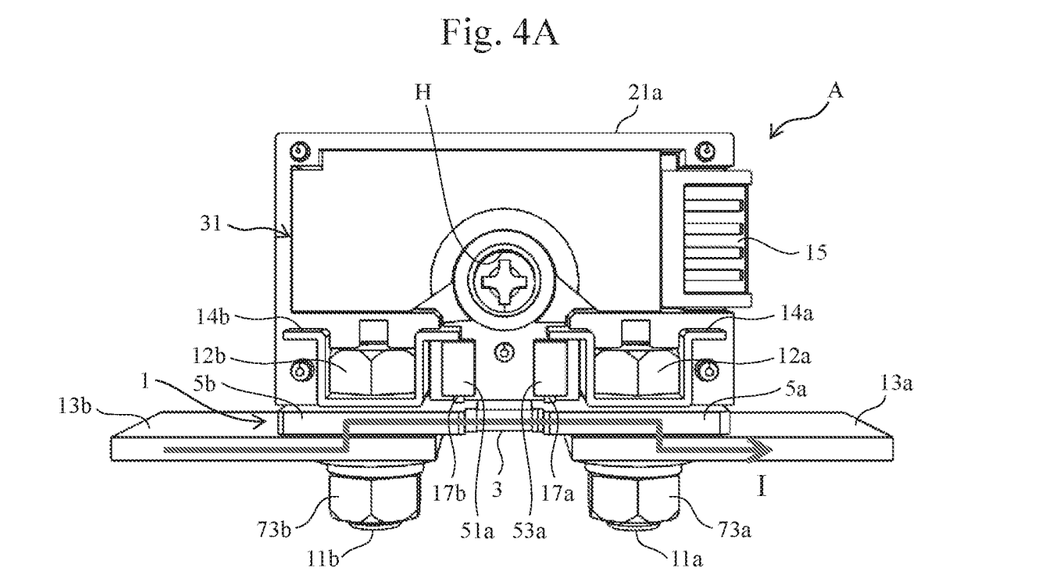
FIG. 4A is a front view of the structure of a shunt resistor attached to a case.
Figure 4B:
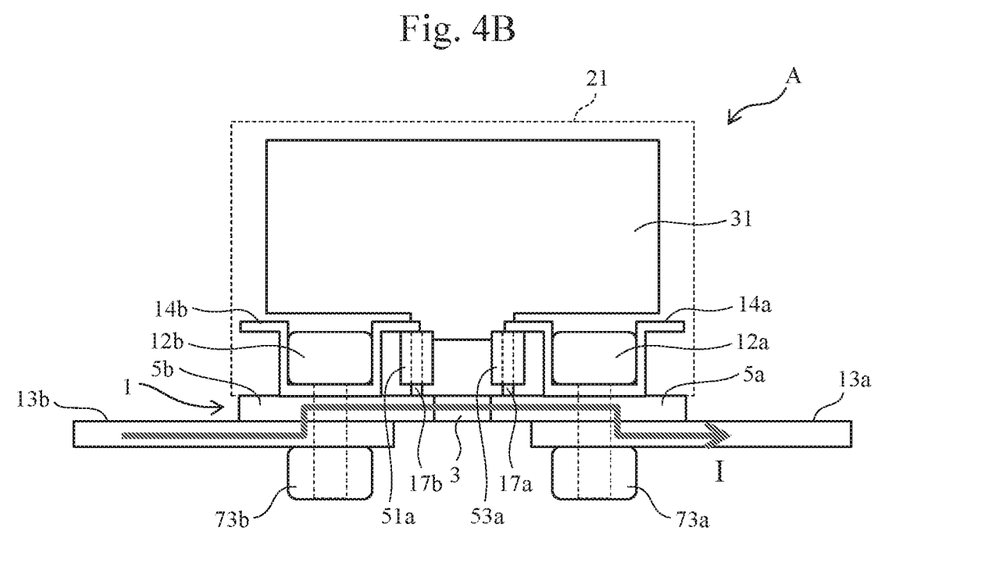
FIG. 4B illustrates the structure of a circuit board, which is housed in a circuit board within a case, and a shunt resistor that are attached together.
Figure 4C:
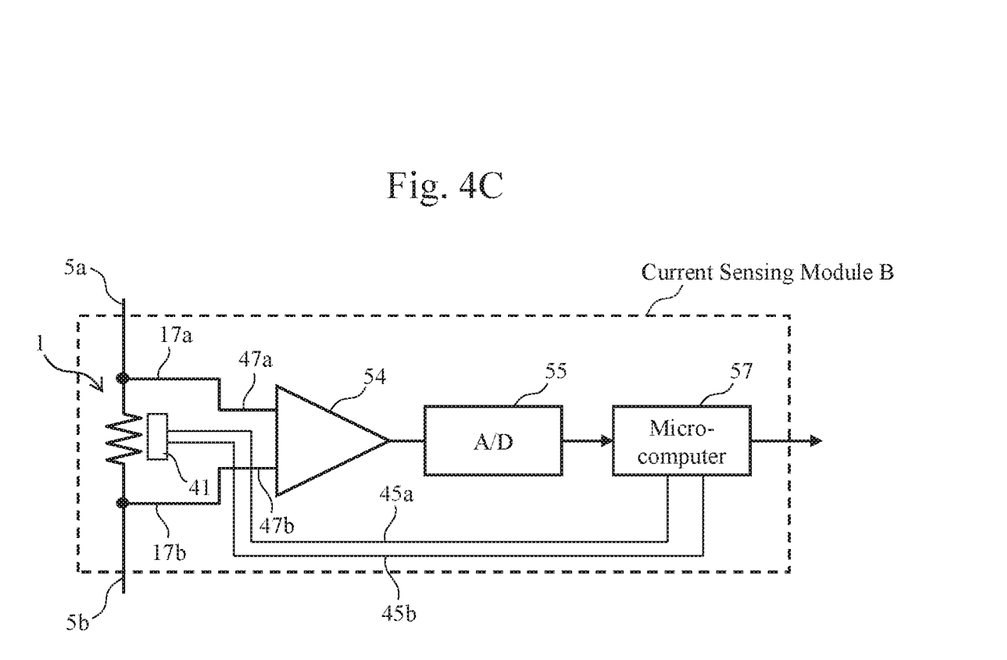
FIG. 4C is a circuit block diagram illustrating an exemplary configuration of a current sensing module including a circuit board and a shunt resistor.

FIG. 4A is a front view of a structure obtained by attaching the shunt resistor 1 to the case 21 (where the case 21b is omitted). FIG. 4B illustrates the structure of the circuit board 31, which is housed in the housing portion 36 within the case, and the shunt resistor 1 that are attached together. FIG. 4C is a circuit block diagram illustrating an exemplary configuration of a current sensing module B including the circuit board 31 and the shunt resistor 1.

The shunt resistor 1 includes a resistive element 3 and first and second electrodes (i.e., a pair of terminal portions) 5a and 5b provided on opposite sides thereof. The circuit board 31, which will be described later, is provided with wires for extracting voltage signals from the shunt resistor 1.

The shunt resistor 1 has a butt-joint structure obtained by butt-joining end faces of the resistive element 3 and the first and second electrodes 5a and 5b. The shunt resistor 1 can be applied to a structure in which a resistive element and electrodes are coupled together with their surfaces' ends overlapping one another. As the current sensing conductor, a conductor without the resistive element 3, for example, a bus bar made of only copper may also be used. For the resistive element 3, a resistive material, such as a Cu—Ni-based material, a Ni—Cr-based material, or a Cu—Mn-based material, can be used. For the first and second electrodes 5a and 5b, materials such as Cu can be used. The joined portions of the resistive element 3 and the first and second electrodes 5a and 5b can be formed using electron beam welding, laser beam welding, cladding, or brazing with metallic nano paste, for example.

As illustrated in FIG. 4A, the lower faces of the first and second electrodes 5a and 5b have fixed thereto bus bars 13a and 13b that pass target current to be sensed therethrough, respectively.

As illustrated in FIG. 4A, the shunt resistor 1 is attached to the bottom face side of the case 21. The case 21 and the shunt resistor 1 are temporarily fixed together with voltage sensing terminals 17a and 17b, which are formed on the shunt resistor 1, inserted through the terminal fixing portions 51a and 53a. Then, the shunt resistor 1 is fixed to the case 21 with the fixing screws 11a and 11b and nuts 73a and 73b (i.e., second fixing means). Parts of the first and second electrodes 5a and 5b have formed therein through-holes through which the screws 11a and 11b are adapted to pass, respectively. Any other fixing structure may be used for fixing the case 21 and the shunt resistor 1 together. In the example illustrated in FIG. 4A, the bus bars 13a and 13b that pass target current to be sensed therethrough are also fixed when the shunt resistor 1 and the case 21 are fixed together with the screws 11a and 11b and the nuts 73a and 73b.

Alternatively, nuts may be fixed to the fixing brackets 14a and 14b in advance, and the shunt resistor 1 may be fixed to the case 21 using screws.

As illustrated in FIG. 4B, the circuit board 31 is disposed in upright position in the direction perpendicular to the shunt resistor 1, for example, thus forming the body.

As described above, the case 21 has the shape of a rectangular parallelepiped, for example, and includes a housing space capable of housing the body. If the case 21 is designed such that the depth of its housing space in the direction in which the circuit board 31 is inserted is equal to the length of the circuit board 31 in its insertion direction, the footprint of the current measuring device A can be reduced.

In addition, the circuit board 31 and the shunt resistor 1 are disposed so that the longitudinal direction of the circuit board 31 and the longitudinal direction of the shunt resistor 1 are parallel with each other. Therefore, the circuit board 31 can be housed within the width of the shunt resistor 1 as seen in a plan view, and the current measuring device can have a reduced size and thus can be mounted in a narrow portion.

The case 21 can have any shape depending on a device used and a place where the device is disposed, for example.

The aforementioned current measuring device A senses the amount of current flowing through a battery (or cells), for example, to sense the state of charge of the battery. The shunt resistor 1 has the first and second electrodes 5a and 5b adapted to be coupled to a current path for passing target current to be measured therethrough, and generates a potential difference according to changes in the amount of current. Then, the state of the battery is sensed from a voltage drop generated in the shunt resistor 1.

FIG. 4C is a functional block diagram illustrating an exemplary configuration of the current sensing device (i.e., current sensing module B).

As illustrated in FIGS. 4B and 4C, the circuit board 31 has mounted thereon an amplifier 54, an A/D converter 55, and a micro-computer 57, for example, and the circuit board 31 also includes wire patterns 45a, 45b, 47a, and 47b, for example.

The voltage sensing terminals 17a and 17b of the shunt resistor 1 are inserted through the terminal fixing portions 51a and 53a formed on the circuit board 31. Therefore, the voltage sensing terminals 17a and 17b and the wire patterns 47a and 47b of the circuit board 31 are reliably coupled together even in a state in which the circuit board 31 is disposed in an upright position.

The coupling structure will be described with reference to FIG. 5.

Further, a temperature sensing element 41 is disposed around the resistive element 3, for example, on the circuit board 31, and between the terminal fixing portions 51a and 53a on the board, for example. The temperature sensing element 41 sends a temperature signal to the microcomputer 57, and the microcomputer 57 corrects a voltage signal according to the temperature (performs TCR correction) so as to output an appropriate sensed current signal.

The circuit board 31 is disposed upright on the bottom face of the case 21. Thus, electronic components that are weak against heat or are susceptible to the influence of heat, such as the electronic components (35a, 35b, 55, and 57) like ICs, are disposed on the upper portion of the circuit board 31 so that the electronic components can be isolated from the resistive element 3 generating heat. Thus, a decrease in the current sensing accuracy due to heat generated can be suppressed.

Other components that are insusceptible to the influence of heat are disposed on portions other than the upper portion of the circuit board 31 so that the mount area of the circuit board 31 can be effectively utilized. Further, since the width of the case 21 that is needed to house the circuit board 31 can be reduced, the overall size of the current sensing device can be reduced.

It should be noted that among the electronic components and the shunt resistor 1 forming the current sensing module B, wires other than the shunt resistor 1 are disposed on the circuit board 31. In the present embodiment, the entire outer portion indicated by reference numeral 31 in FIG. 3 and the like on which wires and electronic components are mounted, for example, is referred to as a circuit board. The outer portion may also be the outer portion of a resin molded module formed by sealing electronic components through resin injection, for example.

Figure 5:
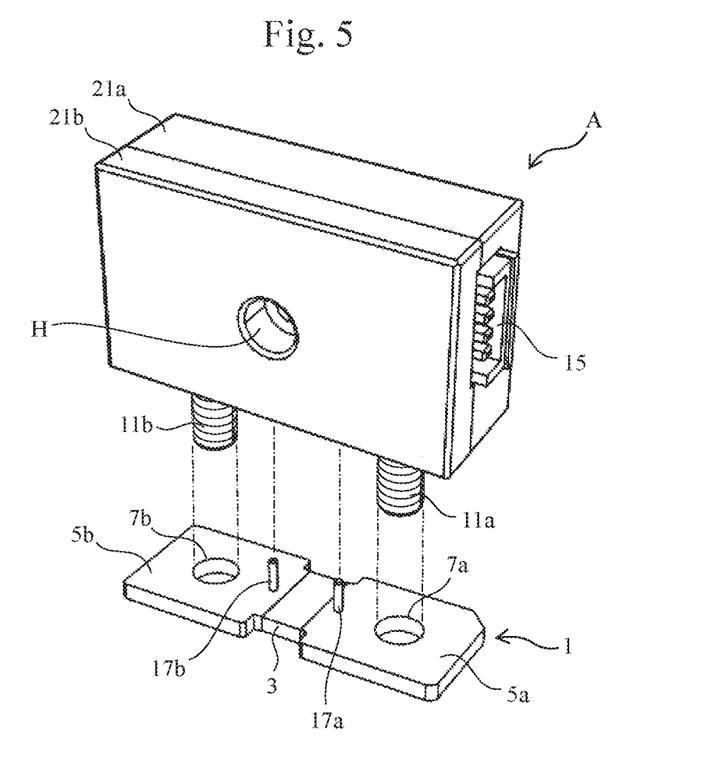
FIG. 5 is a perspective view of a detailed configuration example of a shunt resistor, which illustrates the positional relationship when a case is attached to the shunt resistor.

FIG. 5 is a perspective view of a detailed configuration example of the shunt resistor 1, and also illustrates the positional relationship when the case 21 is attached to the shunt resistor 1.

The portions of the first and second electrodes 5a and 5b have holes 7a and 7b formed therein, respectively. In addition, the screws 11a and 11b are inserted through the holes 7a and 7b, respectively. Press-fitting or welding may be used as the method of fixing the screws 11a and 11b to the shunt resistor 1.

Figure 6:
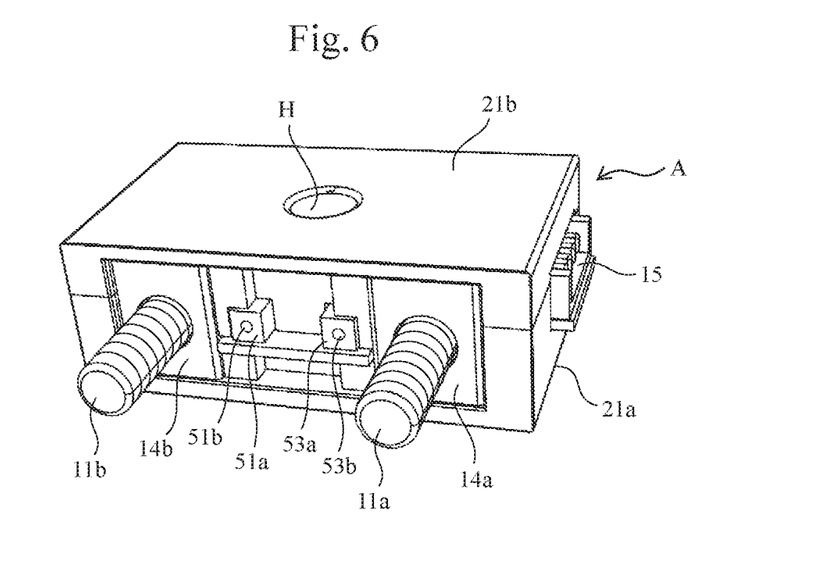
FIG. 6 is a perspective view of an exemplary step of attaching a shunt resistor to a case, specifically, a view illustrating a state before the shunt resistor is attached to the case, and is a view of the bottom face of the case as seen obliquely.
Figure 7:
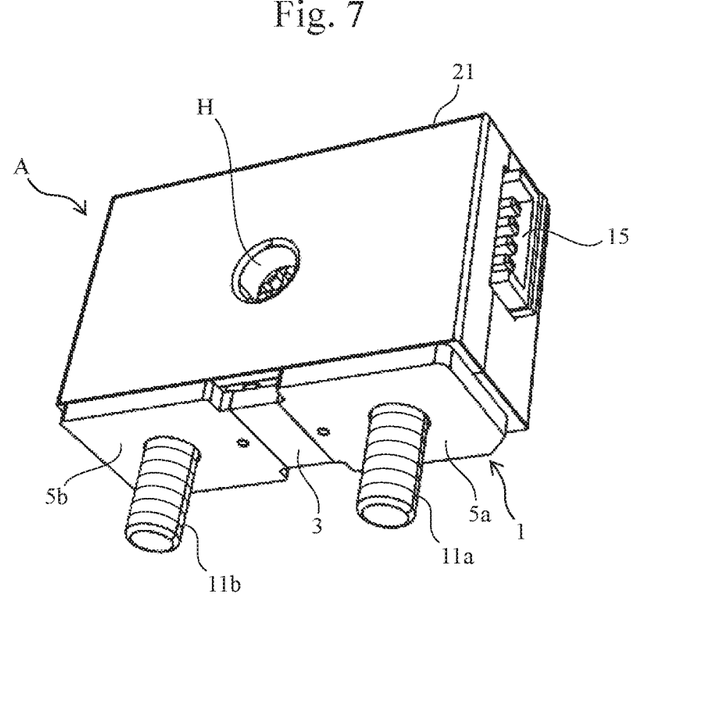
FIG. 7 is a perspective view of an exemplary step of attaching a shunt resistor to a case, specifically, a view illustrating a state after the shunt resistor is attached to the case, and is a view of the bottom face of the case as seen obliquely.
Figure 8:
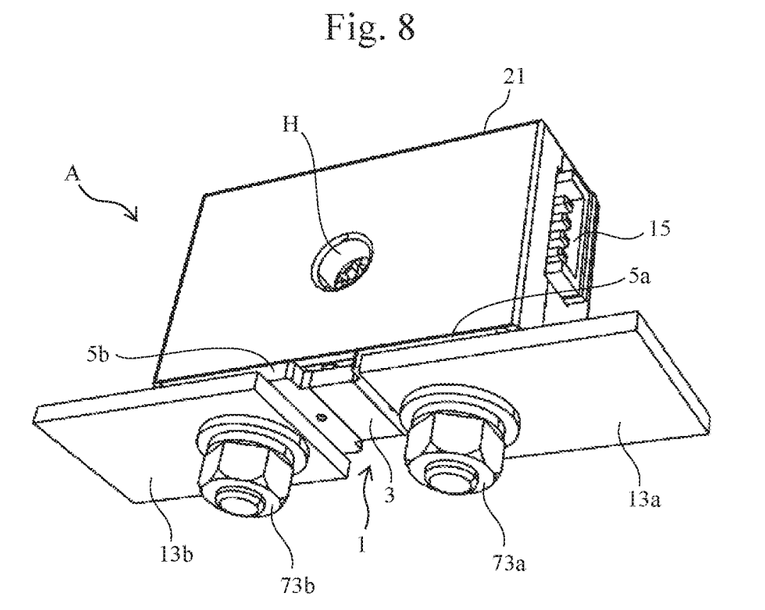
FIG. 8 is a perspective view of an exemplary step of attaching a shunt resistor to a case, specifically, a view illustrating a state after the shunt resistor is attached to the case and is then fixed thereto with nuts, and is a view of the bottom face of the case in a state in which the current sensing device is mounted on the case as seen obliquely.

FIGS. 6 to 8 are perspective views each illustrating an exemplary step of attaching the shunt resistor 1 to the case 21. Description will be made hereinafter with also reference to FIG. 5.

FIG. 6 illustrates a state before the shunt resistor 1 is attached to the case 21, and illustrates the bottom face of the case 21 as seen obliquely.

As illustrated in FIG. 6, the fixing screws 11a and 11b are disposed on the bottom face side of the case 21, and further, the terminal fixing portions 51a and 53a, which have the terminal fixing portions (i.e., fixing holes) 51b and 53b through which the voltage sensing terminals 17a and 17b of the shunt resistor 1 are adapted to be inserted, respectively, are also disposed on the bottom face side of the case 21. When the shunt resistor 1 is inserted into the case 21 from the bottom face side of the case 21 as illustrated in FIGS. 5 and 6, the shunt resistor 1 is fixed to the bottom face of the case 21 as illustrated in FIG. 7, and further, the screws 11a and 11b for fixing the shunt resistor to the case 21 protrude beyond the case 21. In such a state, as illustrated in FIG. 8, the shunt resistor 1 is fixed to the case 21 with the nuts 73a and 73b. The bus bars 13a and 13b that pass target current to be sensed therethrough are also fixed to the case 21. That is, FIG. 8 is a perspective view of a state in which the current sensing device of the present invention is mounted on a target device whose current is to be sensed, such as a battery.

In the current sensing device according to the present embodiment, the shunt resistor 1 can be fixed to the bottom face side of the case, which houses the circuit board, with fixing screws attached to the fixing brackets disposed in the case, and nuts.

With the fixing screws disposed in the case 21, the shunt resistor can be compactly fixed to the case.

Next, the current sensing device B according to the second embodiment of the present invention will be described.

Figure 9:
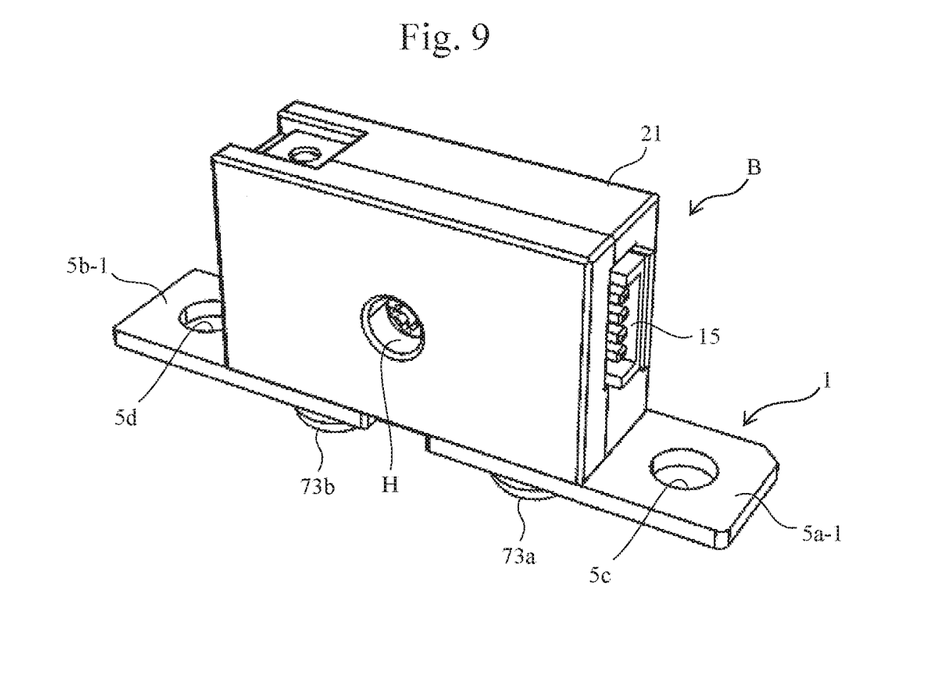
FIG. 9 is a perspective view of an exemplary external configuration of a current sensing device according to a second embodiment of the present invention.
Figure 10:
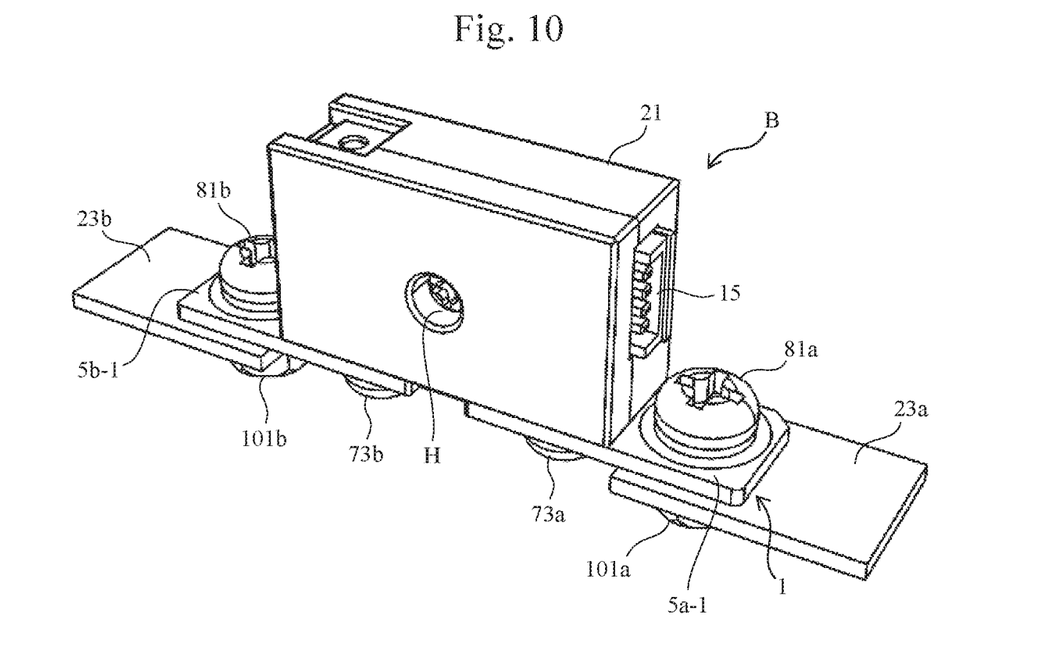
FIG. 10 is a perspective view of an exemplary external configuration of a current sensing device obtained by further attaching a bus bar to the structure illustrated in FIG. 9.
Figure 11:
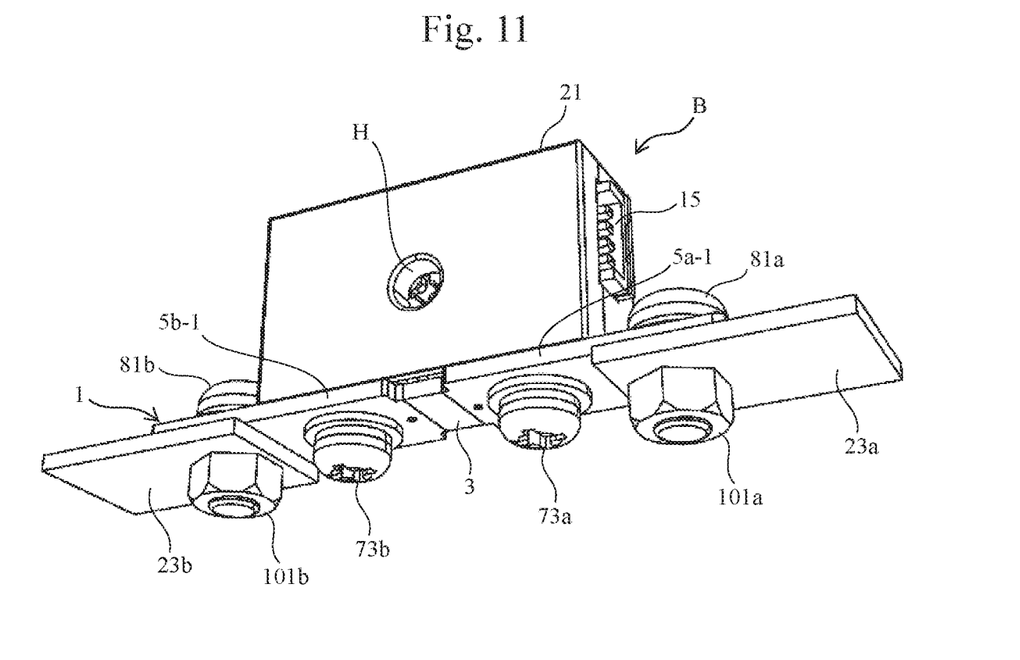
FIG. 11 is a perspective view of the structure of FIG. 10 as seen from its bottom face side.
Figure 12:
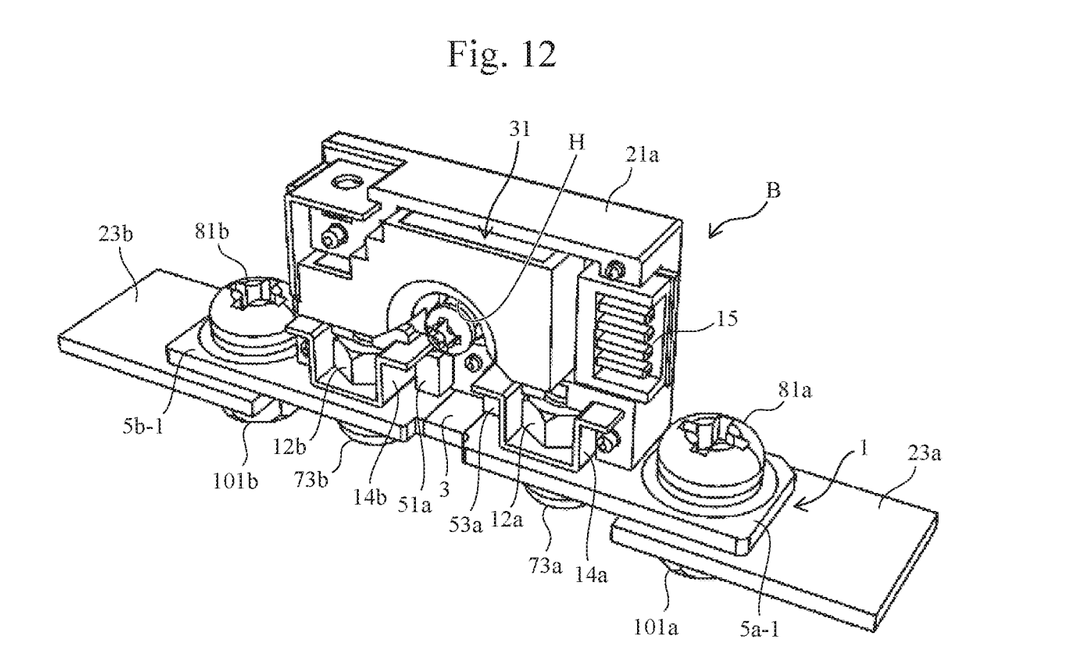
FIG. 12 is a perspective view of the structure illustrated in FIGS. 10 and 11 as seen from its lateral side, in which the front-side case has been removed so as to allow the inside of the case to be seen.

FIG. 9 is a perspective view of an exemplary external configuration of the current sensing device according to the present embodiment. FIG. 10 is a perspective view of an exemplary external configuration of the current sensing device illustrated in FIG. 9 mounted on bus bars. FIG. 11 is a perspective view of the structure in FIG. 10 as seen from its bottom face side. FIG. 12 is a perspective view of the current measuring device according to the present embodiment, and illustrates an exemplary external configuration in which the front-side case 21b is detached from the body so as to allow an internal structure including the circuit board to be seen.

In the structure illustrated in FIG. 9, the length of the shunt resistor 1 is longer than the length between opposite ends of the case 21 in the longitudinal direction. Pass-through portions 5c and 5d are provided in regions of the electrodes 5a-1 and 5b-1 that protrude beyond the opposite sides of the case 21, respectively.

As illustrated in FIGS. 10, 11, and 12, bus bars 23a and 23b are fixed to the protruding regions of the electrodes 5a-1 and 5b-1, respectively. To fix the electrodes 5a-1 and 5b-1 and the bus bars 23a and 23b, respectively, together, the pass-through portions 5c and 5d of the electrodes 5a-1 and 5b-1 are aligned with the through-holes formed in the bus bars 23a and 23b, and then, the electrodes 5a-1 and 5b-1 and the bus bars 23a and 23b are securely fastened together with screws 81a and 81b and nuts 101a and 101b, respectively.

According to the present embodiment, the case 21 and the shunt resistor 1 are fixed together with screws, which have heads indicated by reference numerals 12a and 12b, and with nuts 73a and 73b in FIG. 12. Meanwhile, the electrodes 5a-1 and 5b-1 of the shunt resistor 1 and the current wires (i.e., bus bars) 23a and 23b are fixed together with the screws 81a and 81b and nuts 101a and 101b, respectively. Washers are disposed between the screws and the nuts for fixation.

Although each of the aforementioned embodiments illustrates a structure in which the shunt resistor 1 is attached to the circuit board 31, a bus bar may be used instead of the shunt resistor. That is, any conductor that can sense a potential difference may be used.

As described above, according to the current sensing device of the present embodiment, a current measuring device can be made compact. Thus, the current measuring device is unlikely to become obstructive even when it is attached to a battery. Further, electronic components can be easily mounted on the current measuring device. Since the current measuring device is protected by a case, it is resistant to impacts and thus can also be attached to an automobile, for example.

In the aforementioned embodiments, the configurations and the like illustrated in the accompanying drawings are not limited thereto, and can be changed as appropriate within the range that the advantageous effects of the present invention can be exerted. Besides, the configurations and the like can be changed as appropriate without departing from the spirit and scope of the present invention.

INDUSTRIAL APPLICABILITY

The present invention is applicable to current sensing devices.

All publications, patents, and patent applications cited in this specification are incorporated herein by reference in their entirety.

What is claimed is:

1. A current measuring device for measuring current, comprising:
   a conductor adapted to pass current therethrough;
   a circuit board with a pair of terminals, the pair of terminals being adapter to extract a voltage signal from the conductor;
   a cover member adapted to house the circuit board;
   at least one fastener provided in the cover member, wherein the at least one fastener is extensive through a hole formed in the conductor;
   at least one holders provided in the cover member and configured to restrict the at least one fastener from rotating; and
   at least one mating member configured to mate the at least one fastener to press-hold the conductor between the at least one fastener and the at least one mating member at a bottom of the cover member.

2. The current measuring device according to claim 1, wherein the circuit board is disposed to stand upright with respect to the conductor.

3. The current measuring device according to claim 1, wherein the circuit board is disposed within a plane of the conductor.

4. The current measuring device according to claim 1, wherein:
   the pair of terminals are disposed to stand upright on the conductor, and
   the circuit board has wires connected, respectively, to and the pair of terminals.

5. The current measuring device according to claim 1, further comprising a bus bar disposed between the at least one fastener and the at least one mating member.

* * * * *

UNITED STATES PATENT AND TRADEMARK OFFICE
CERTIFICATE OF CORRECTION

PATENT NO. : 11,061,054 B2  
APPLICATION NO. : 16/624640  
DATED : July 13, 2021  
INVENTOR(S) : Tamotsu Endo Page 1 of 1

It is certified that error appears in the above-identified patent and that said Letters Patent is hereby corrected as shown below:

In the Claims

In Column 8, Claim 1, Line 13, delete "adapter" and replace with --adapted--.

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*